(12) United States Patent
Reznicek et al.

(10) Patent No.: US 10,998,444 B2
(45) Date of Patent: May 4, 2021

(54) STACKED FINFET MASKED-PROGRAMMABLE ROM

(71) Applicant: International Business Machines Corporation, Armonk, NY (US)

(72) Inventors: Alexander Reznicek, Troy, NY (US); Karthik Balakrishnan, Scarsdale, NY (US); Tak Ning, Yorktown Heights, NY (US); Bahman Hekmatshoartabari, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/272,617

(22) Filed: Feb. 11, 2019

(65) Prior Publication Data

US 2020/0259013 A1 Aug. 13, 2020

(51) Int. Cl.
*H01L 29/78* (2006.01)
*H01L 21/283* (2006.01)
(Continued)

(52) U.S. Cl.
CPC ...... *H01L 29/785* (2013.01); *H01L 21/02532* (2013.01); *H01L 21/02636* (2013.01); *H01L 21/283* (2013.01); *H01L 21/823431* (2013.01); *H01L 21/823437* (2013.01); *H01L 21/823487* (2013.01); *H01L 27/11206* (2013.01);
(Continued)

(58) Field of Classification Search
CPC ......... H01L 21/02532; H01L 21/02636; H01L 21/283; H01L 21/823431; H01L 21/823437; H01L 21/8221; H01L 21/823807; H01L 21/823821; H01L 21/823828; H01L 21/823842; H01L 21/823878; H01L 21/845; H01L 27/11206; H01L 27/11551; H01L 27/0688; H01L 27/092; H01L 27/0924; H01L 27/1211; H01L 29/785; H01L 29/66795; H01L 29/7827; H01L 29/0673; H01L 29/42392; H01L 29/4966; H01L 29/66545; H01L 29/78654; H01L 29/78684; H01L 29/78696

See application file for complete search history.

(56) References Cited

U.S. PATENT DOCUMENTS 9,362,277 B2 6/2016 Chi et al.
9,812,575 B1 11/2017 Reznicek et al.
(Continued)

*Primary Examiner* — Joseph M Galvin, III
(74) *Attorney, Agent, or Firm* — Scully, Scott, Murphy & Presser, P.C.; L. Jeffrey Kelly, Esq.

(57) ABSTRACT

A stacked FinFET mask-programmable read only memory (ROM) is provided. The stacked FinFET mask-programmable ROM includes a fin structure extending upward from an insulator layer. In accordance with the present application, the fin structure includes, from bottom to top, a lower programmable semiconductor fin portion having a first threshold voltage, an insulator fin portion, and an upper programmable semiconductor fin portion having a second threshold voltage. A lower gate structure contacts a sidewall of the lower programmable semiconductor fin portion, and an upper gate structure contacts a sidewall of the upper programmable semiconductor fin portion.

20 Claims, 11 Drawing Sheets

(51) Int. Cl.
  *H01L 29/66*      (2006.01)
  *H01L 21/02*      (2006.01)
  *H01L 27/11551*   (2017.01)
  *H01L 21/8234*    (2006.01)
  *H01L 27/112*     (2006.01)

(52) U.S. Cl.
  CPC .. *H01L 27/11551* (2013.01); *H01L 29/66795* (2013.01); *H01L 29/7827* (2013.01)

(56) References Cited

U.S. PATENT DOCUMENTS

| | | |
|---|---|---|
| 9,960,271 B1 | 5/2018 | Xie et al. |
| 10,084,090 B2 | 9/2018 | Cheng et al. |
| 2009/0163009 A1* | 6/2009 | Purayath ............ H01L 29/7881 438/587 |
| 2015/0069458 A1* | 3/2015 | Li ...................... H01L 29/7827 257/105 |
| 2016/0071932 A1* | 3/2016 | Sung ................ H01L 21/76224 257/369 |
| 2016/0336421 A1* | 11/2016 | Cheng ................ H01L 21/8221 |
| 2017/0133507 A1* | 5/2017 | Cheng .................... H01L 29/16 |
| 2018/0090497 A1 | 3/2018 | Walke et al. |
| 2018/0114793 A1* | 4/2018 | Lee .................... H01L 29/7883 |
| 2018/0350989 A1 | 12/2018 | Cheng et al. |
| 2019/0326416 A1* | 10/2019 | Huang ............. H01L 29/66719 |

\* cited by examiner

STACKED FINFET MASKED-PROGRAMMABLE ROM

BACKGROUND

The present application relates to a semiconductor structure and a method of forming the same. More particularly, the present application relates to a stacked FinFET mask-programmable read only memory (ROM).

Monolithic three-dimensional (3D) integration is considered as an alternative approach to expensive extreme ultra-violet (EUV) lithography to continue density scaling. One scenario is to stack an n-type field effect transistor (nFET) and a p-type field effect transistor (pFET) on top of each other creating a stacked FinFET structure.

Stacked FinFET structures also need memory cells. Floating gate memory cells, which form the basis of non-volatile memory such as, for example, flash, programmable read only memory (PROM), erasable programmable read only memory (EPROM) and electrically erasable read only memory (EEPROM), are critical to the implementation of any technology. Existing methods to co-integrate non-volatile memories with stacked FinFET include complex processing steps. There is thus a need to co-integrate non-volatile memories with a stacked FinFET using a simply process in order to enable stacked FinFET circuits.

SUMMARY

A stacked FinFET mask-programmable read only memory (ROM) is provided. The term "mask-programmable read only memory (ROM)" denotes a non-volatile memory in which the data is programmable into the structure during manufacturing, so it is typically used for large production runs; a mask-programmable ROM cannot be rewritten with new data.

In one aspect of the present application, a stacked FinFET mask-programmable ROM is provided. In one embodiment, the stacked FinFET mask-programmable ROM includes a fin structure extending upward from an insulator layer. In accordance with the present application, the fin structure includes, from bottom to top, a lower programmable semiconductor fin portion having a first threshold voltage, an insulator fin portion, and an upper programmable semiconductor fin portion having a second threshold voltage. A lower gate structure contacts a sidewall of the lower programmable semiconductor fin portion, and an upper gate structure contacts a sidewall of the upper programmed semiconductor fin portion.

In one embodiment, the first and the second threshold voltages are the same, and the lower programmable semiconductor fin portion and the upper programmable semiconductor fin portion are programmed to have a same value. In such an embodiment, the lower programmable semiconductor fin portion and the upper semiconductor fin portion are both programmed as "0" or "1".

In another embodiment, the first threshold voltage is different from the second threshold voltage, and the lower programmable semiconductor fin portion and the upper programmable semiconductor fin portion are programmed to have different values. In such an embodiment, the lower programmable semiconductor fin portion is programmed as "0", and the upper programmable semiconductor fin portion is programmed as "1". Alternatively, and in such an embodiment, the lower programmable semiconductor fin portion is programmed as "1", and the upper programmable semiconductor fin portion is programmed as "0".

In another aspect of the present, a stacked FinFET mask-programmable ROM array is provided. In one embodiment, the array includes a first stacked FinFET mask-programmable ROM memory that includes a first fin structure extending upward from an insulator layer, wherein the first fin structure comprises, from bottom to top, a lower programmable semiconductor fin portion programmed as "0", an insulator fin portion, and an upper programmable semiconductor fin portion programmed as "1", a first lower gate structure contacting a sidewall of the lower programmable semiconductor fin portion of the first fin structure, and a first upper gate structure contacting a sidewall of the second programmable semiconductor fin portion of the first fin structure.

The array further includes a second stacked FinFET mask-programmable ROM memory that includes a second fin structure extending upward from the insulator layer, wherein the second fin structure comprises, from bottom to top, a lower programmable semiconductor fin portion programmed as "1", an insulator fin portion, and an upper programmable semiconductor fin portion programmed as "0", a second lower gate structure contacting a sidewall of the lower programmable semiconductor fin portion of the second fin structure, and a second upper gate structure contacting a sidewall of the second programmable semiconductor fin portion of the second fin structure.

The array further includes a third stacked FinFET mask-programmable ROM memory that includes a third fin structure extending upward from the insulator layer, wherein the third fin structure comprises, from bottom to top, a lower programmable semiconductor fin portion programmed as "0", an insulator fin portion, and an upper programmable semiconductor fin portion programmed as "0", a third lower gate structure contacting a sidewall of the lower programmable semiconductor fin portion of the third fin structure, and a third upper gate structure contacting a sidewall of the second programmable semiconductor fin portion of the third fin structure.

The array also includes a fourth stacked FinFET mask-programmable ROM memory that includes a fourth fin structure extending upward from the insulator layer, wherein the fourth fin structure comprises, from bottom to top, a lower programmable semiconductor fin portion programmed as "1", an insulator fin portion, and an upper programmable semiconductor fin portion programmed as "1", a fourth lower gate structure contacting a sidewall of the lower programmable semiconductor fin portion of the fourth fin structure, and a fourth upper gate structure contacting a sidewall of the second programmable semiconductor fin portion of the fourth fin structure.

In yet other aspect of the present application, a method of forming a stacked FinFET mask-programmable ROM is provided. In one embodiment, the method includes forming a fin structure extending upward from an insulator layer, wherein the fin structure comprises, from bottom to top, a lower programmable semiconductor fin portion having a first threshold voltage, an insulator fin portion, and an upper programmable semiconductor fin portion having a second threshold voltage. Next, a lower gate structure is formed contacting a sidewall of the lower programmable semiconductor fin portion, and an upper gate structure is formed contacting a sidewall of the upper programmable semiconductor fin portion.

DETAILED DESCRIPTION

Figure 1:
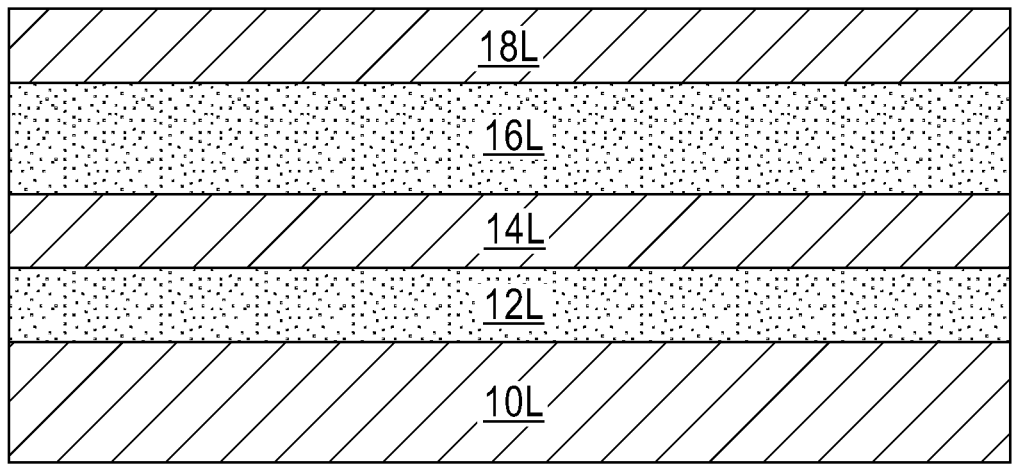
FIG. 1 is a cross sectional view of an exemplary semiconductor structure including a semiconductor substrate, a first insulator layer, a first semiconductor material layer, a second insulator layer, and a second semiconductor material layer that can be employed in the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure including a semiconductor substrate 10L, a first insulator layer 12L, a first semiconductor material layer 14L, a second insulator layer 16L, and a second semiconductor material layer 18L that can be employed in the present application.

Semiconductor substrate 10L includes at least one semiconductor material having semiconducting properties. Examples of semiconductor materials that can provide the semiconductor substrate 10L include, for example, silicon (Si), germanium (Ge), silicon germanium alloys (SiGe), silicon carbide (SiC), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

The semiconductor substrate 10L can be a single crystalline semiconductor material. The semiconductor substrate 10L can have any of the well known crystal orientations. For example, the crystal orientation of the semiconductor substrate 10L may be {100}, {110}, or {111}. Other crystallographic orientations besides those specifically mentioned can also be used in the present application.

The first insulator layer 12L, which is located on a topmost surface of the semiconductor substrate 10L, may include a crystalline or non-crystalline dielectric material. In one example, the first insulator layer 12L may be composed of silicon dioxide and/or boron nitride. The first insulator layer 12L may have a thickness from 20 nm to 100 nm.

Other thicknesses that are less than 20 nm and greater than 100 nm can also be used as the thickness of the first insulator layer 12L.

The first semiconductor material layer 14L, which is located on a topmost surface of the first insulator layer 12L, is composed of one of the semiconductor materials mentioned above for the semiconductor substrate 10L. In one embodiment, the first semiconductor material layer 14L is composed of a same semiconductor material as the semiconductor substrate 10L. In another embodiment, the first semiconductor material layer 14L may be composed of a different semiconductor material than the semiconductor substrate 10L. The first semiconductor material layer 14L may have a thickness from 50 nm to 250 nm. Other thicknesses that are less than 50 nm and greater than 250 nm can also be used as the thickness of the first semiconductor material layer 14L.

The second insulator layer 16L, which is located on a topmost surface of the first semiconductor material layer 14L, may include a crystalline or non-crystalline dielectric material. The dielectric material that provides the second insulator layer 16L may be the same as, or different from, the dielectric material that provides the first insulator layer 12L. In one example, the second insulator layer 16L may be composed of silicon dioxide and/or boron nitride. The second insulator layer 16L may have a thickness within the thickness range mentioned above for the first insulator layer 12L.

The second semiconductor material layer 18L, which is located on a topmost surface of the second insulator layer 16L, is composed of one of the semiconductor materials mentioned above for the semiconductor substrate 10L. In one embodiment, the second semiconductor material layer 18L is composed of a same semiconductor material as the semiconductor substrate 10L. In another embodiment, the second semiconductor material layer 18L may be composed of a different semiconductor material than the semiconductor substrate 10L. The semiconductor material that provides the second semiconductor material layer 18L may be compositionally the same as, or compositionally different from, the semiconductor material that provides the first semiconductor material layer 14L. In one example, the first and second semiconductor material layers 14L, 18L are both composed of silicon. The second semiconductor material layer 18L may have a thickness within the thickness range mentioned above for the first semiconductor material layer 14L.

The exemplary semiconductor structure of FIG. 1 can be formed utilizing any conventional process. In one embodiment, the exemplary semiconductor structure of FIG. 1 can be formed by first providing, and in any order, a semiconductor-on-insulator (SOI) substrate that includes the semiconductor substrate 10L, the first insulator layer 12L, and the first semiconductor material layer 14L, and a semiconductor wafer that includes a handle substrate (not shown), the second semiconductor material layer 18L and the second insulator layer 16L. A wafer bonding process is then used to bond the first semiconductor material layer 14L of the SOI substrate to the second insulator layer 16L of the semiconductor wafer. After wafer bonding, the handle substrate is removed providing the exemplary semiconductor structure of FIG. 1.

Figure 2:
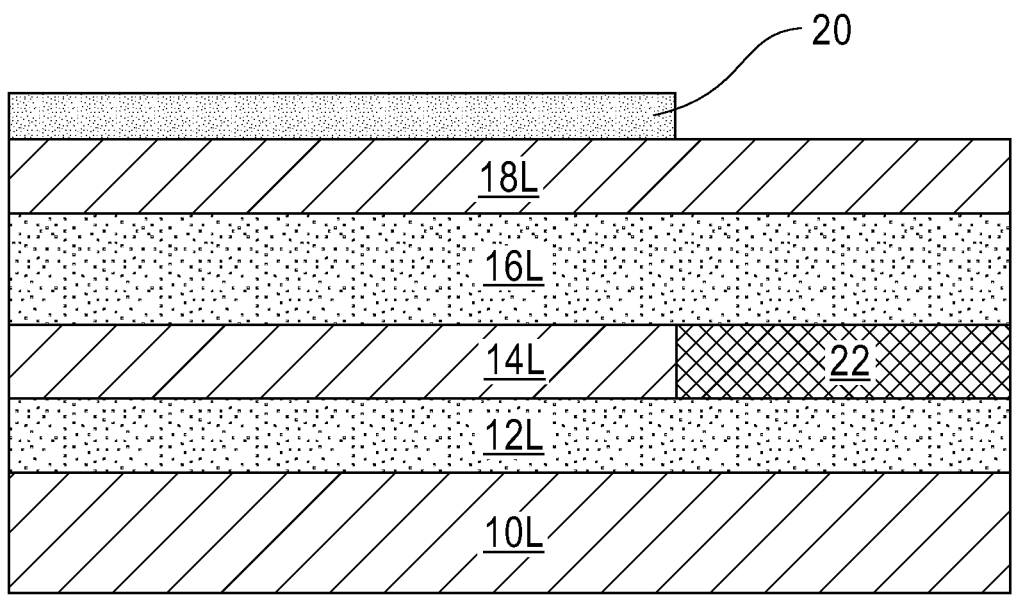
FIG. 2 is a cross sectional view of the exemplary semiconductor structure of FIG. 1 after forming a first mask on a portion of the second semiconductor material layer, and thereafter forming a first programmable region in a first portion of the first semiconductor material layer not covered by the first mask.

Referring now to FIG. 2, there is illustrated the exemplary semiconductor structure of FIG. 1 after forming a first mask 20 on a portion of the second semiconductor material layer 18L, and thereafter forming a first programmable region 22 in a first portion of the first semiconductor material layer 14L not covered by the first mask 20.

First mask 20 that can be employed in the present application includes any mask material that can serve as an ion implantation mask. The first mask 20 can have a thickness from 20 nm to 100 nm; although other thicknesses can be used in the present application as the thickness of the first mask 20.

In one embodiment of the present application, first mask 20 is composed of a dielectric hard mask such as, for example, silicon dioxide, silicon nitride, silicon oxynitride or any multilayered stack thereof. In such an embodiment, the dielectric hard mask can be formed by first depositing a blanket layer of dielectric hard mask material on the physically exposed topmost surface of the second semiconductor material layer 18L, and then the blanket layer of dielectric hard mask material is patterned by lithography and etching. The patterned dielectric hard mask material, i.e., the first hard mask 20, has an opening that physically exposes a portion of the second semiconductor material layer 18L. Lithography includes forming a photoresist material on a surface of a material or a stack of materials that needs to be patterned, exposing the photoresist material to a pattern of irradiation, and then developing the exposed photoresist material utilizing a conventional resist developer. Etching may include a dry etching process such as, for example, reaction ion etching or plasma etching, and/or a chemical wet etching process. In another embodiment, the first mask 20 may be a photoresist material. In such an embodiment, the first mask 20 containing the photoresist material can be formed by first depositing a blanket layer of photoresist material and thereafter patterning the blanket layer by utilizing lithography, as defined above.

With the first mask 20 present, the first programmable region 22 is formed in a first portion of the first semiconductor material layer 14L which is not covered by the first mask 20. The first programmable region 22 can be formed by ion implantation in which either an n-type or p-type dopant is introduced into the first portion of the first semiconductor material layer 14L that is not covered by the first mask 20. The term "n-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium.

The first programmable region 22 that is formed in the first semiconductor material layer 14L is composed of a doped semiconductor that includes a same semiconductor material as the first semiconductor material layer 14L and an n-type or p-type dopant as defined above.

The concentration of n-type or p-type dopant that is present in the first programmable region 22 that is formed in the first semiconductor material layer 14L determines whether the threshold voltage of the resultant programmable semiconductor fin portion that contains the first programmable region 22 is less than 0, or greater than 0, and therefore whether the resultant programmable semiconductor fin portion that contains the first programmable region 22 can be programmed to have a value of "0" or "1". For threshold voltage of less than 0, the resultant programmable semiconductor fin portion that contains the first programmable region 22 can be programmed to have a value of "1".

For a threshold voltage of greater than 0, the resultant programmable semiconductor fin portion that contains the first programmable region 22 can be programmed to have a value of "0". In one illustrated embodiment, the first programmable region 22 is used to provide a programmable semiconductor fin portion that can be programmed as "0".

In one embodiment, and when the first programmable region 22 is used to provide a programmable semiconductor fin portion with a threshold voltage of less than 0, then the concentration of n-type or p-type dopant present in the first programmable region 22 is from 1e14 atoms/cm$^3$ to 1e17 atoms/cm$^3$. In another embodiment, and when the first programmable region 22 is used to provide a programmable semiconductor fin portion with a threshold voltage of greater than 0, then the concentration of n-type or p-type dopant present in the first programmable region 22 is from 1e16 atoms/cm$^3$ to 1e19 atoms/cm$^3$.

Figure 3:
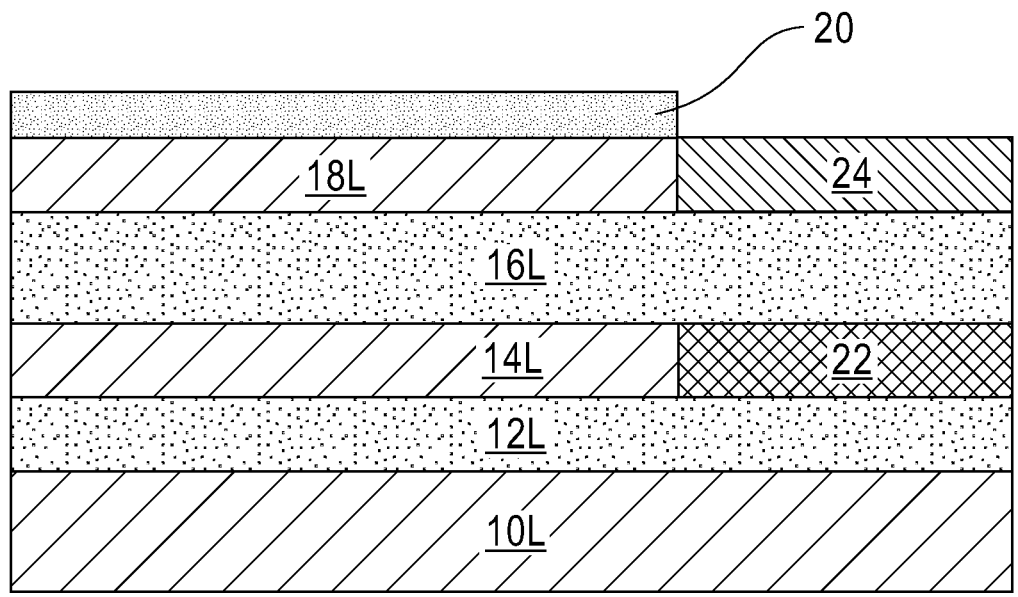
FIG. 3 is a cross sectional view of the exemplary semiconductor structure of FIG. 2 after forming a first programmable region in a first portion of the second semiconductor material layer, and directly above the first programmable region in the first portion of the first semiconductor material layer.

Referring now to FIG. 3, there is illustrated the exemplary semiconductor structure of FIG. 2 after forming a first programmable region 24 in a first portion of the second semiconductor material layer 18L, and directly above the first programmable region 22 in the first portion of the first semiconductor material layer 14L.

With the first mask 20 present, the first programmable region 24 is formed in a first portion of the second semiconductor material layer 18L by ion implantation in which either an n-type or p-type dopant ion, as defined above, is introduced into the first portion of the second semiconductor material layer 18L that is not covered by the first mask 20 and present directly above the first programmable region 22 formed in the first semiconductor material layer 14L.

The first programmable region 24 is composed of a doped semiconductor that includes a same semiconductor material as the second semiconductor material layer 18L and an n-type or p-type dopant as defined above. In one embodiment, the first programmable region 24 that is formed in the second semiconductor material layer 18L contains a same conductivity type dopant as the first programmable region 22 formed in the first semiconductor material layer 14L. In another embodiment, the first programmable region 24 that is formed in the second semiconductor material layer 18L contains a different conductivity type dopant than the first programmable region 22 formed in the first semiconductor material layer 14L.

The concentration of n-type or p-type dopant that is present in the first programmable region 24 that is formed in the second semiconductor layer 18L determines whether the threshold voltage of the resultant programmable semiconductor fin portion that contains the first programmable region 24 is less than 0, or greater than 0, and therefore whether the resultant programmable semiconductor fin portion that contains the first programmable region 24 can be programmed to have a value of "0" or "1". See, the above description for the concentration of n-type dopants for the first programmable region 22, which are applicable here for the first programmable region 24.

In one embodiment, the first programmable region 24 can be used to provide a programmable semiconductor fin portion that can be programmed the same as the programmable semiconductor fin portion that contains the first programmable region 22, i.e., both "0", or both "1". In another embodiment, the first programmable region 24 can be used to provide a programmable semiconductor fin portion that can be programmed differently from the programmable semiconductor fin portion that contains the first programmable region 22, i.e., one "0" and the other "1". By way of illustration, the first programmable region 24 is used to provide a programmable semiconductor fin portion that can be programmed "1", while the first programmable region 22 is used to provide a programmable semiconductor fin portion that can be programmed as "0".

Figure 4:
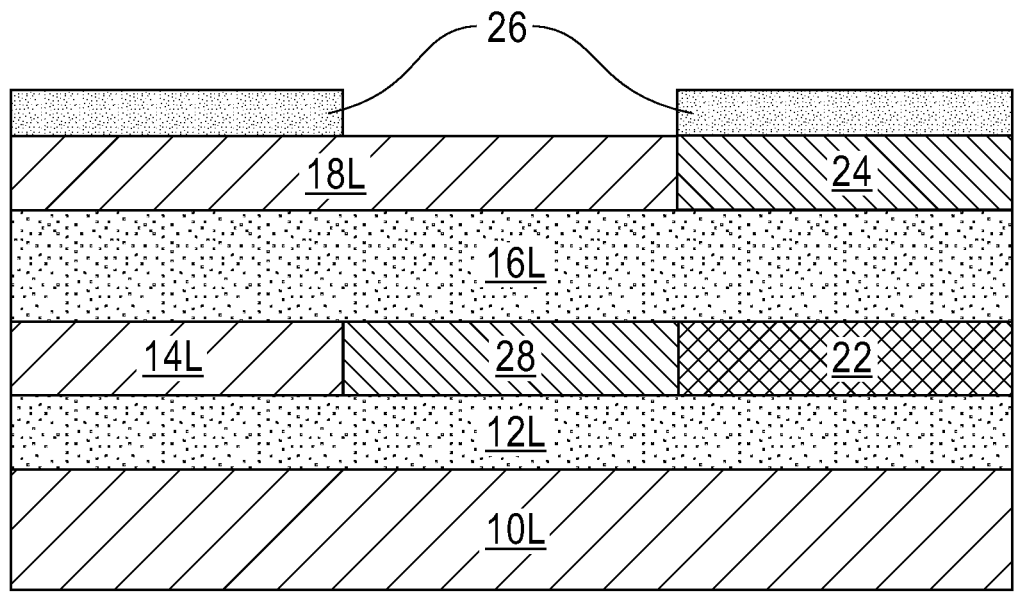
FIG. 4 is a cross sectional view of the exemplary semiconductor structure of FIG. 3 after removing the first mask, forming a second mask on the second semiconductor material layer that physically exposes a portion of the second semiconductor material layer not including the first programmable regions, and thereafter forming a second programmable region in a second portion of the first semiconductor material layer which is laterally adjacent to the first programmable region formed in the first semiconductor material layer, and not covered by the second mask.

Referring now to FIG. 4, there is illustrated the exemplary semiconductor structure of FIG. 3 after removing the first mask 20, forming a second mask 26 on the second semiconductor material layer 18L that physically exposes a portion of the second semiconductor material layer 18L not including the first programmable region 24, and thereafter forming a second programmable region 28 in a second portion of the first semiconductor material layer 14L which is laterally adjacent to the first programmable region 22 formed in the first semiconductor material layer 14L, and not covered by the second mask 26.

First mask 20 may be removed utilizing any material removal process including for example, chemical mechanical polishing, etching or ashing. Second mask 26 may include any mask material (including one of the masking materials mentioned above for first mask 20) that can serve as an ion implantation mask. The second mask 26 can have a thickness from 20 nm to 100 nm; although other thicknesses can be used in the present application as the thickness of the second mask 26. The second mask 26 can be formed utilizing one of the techniques mentioned above for forming the first mask 20. The second mask 26 contains an opening that physically exposes a portion of the second semiconductor material layer 18L not including the first programmable region 24. In one example, the opening present in the second mask 26 physically exposes a portion of the second semiconductor material layer 18L that is directly adjacent to the first programmable region 24.

With the second mask 26 in place, the second programmable region 28 is formed in the first semiconductor material layer 14L. The second programmable region 28 is formed by ion implantation an n-type or p-type dopant, as defined above. The second programmable region 28 is composed of a doped semiconductor that includes a same semiconductor material as the first semiconductor material layer 14L and an n-type or p-type dopant as defined above. The conductivity type of dopant present in the second programmable region 28 may be the same as, or different from, the conductivity type dopant present in the first programmable regions (22, 24).

The concentration of n-type or p-type dopant that is present in the second programmable region 28 that is formed in the first semiconductor layer 14L determines whether the threshold voltage of the resultant programmable semiconductor fin portion that contains the second programmable region 28 is less than 0, or greater than 0, and therefore whether the resultant programmable semiconductor fin portion that contains the second programmable region 28 can be programmed to have a value of "0" or "1". See, the above description for the concentration of n-type dopants for the first programmable region 22, which are applicable here for the second programmable region 28. In one embodiment, the second programmable region 28 can be used to provide a programmable semiconductor fin portion that can be programmed "1".

Figure 5:
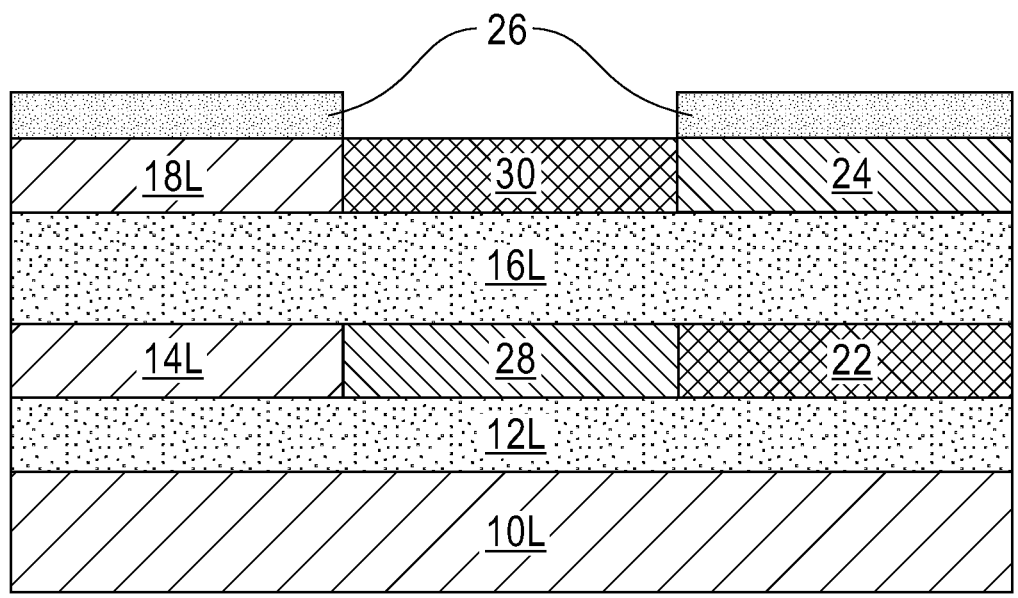
FIG. 5 is a cross sectional view of the exemplary semiconductor structure of FIG. 4 after forming a second programmable region in a second portion of the second semiconductor material layer which is laterally adjacent to the first programmable region formed in the second semiconductor material layer, and directly above the second programmable region formed in the first semiconductor material layer.

Referring now to FIG. 5, there is illustrated the exemplary semiconductor structure of FIG. 4 after forming a second programmable region 30 in a second portion of the second semiconductor material layer 18L which is laterally adjacent to the first programmable region 24 formed in the second semiconductor material layer 18L, and directly above the second programmable region 28 formed in the first semiconductor material layer 14L.

With the second mask 26 in place, the second programmable region 30 is formed in the second semiconductor material layer 18L. The second programmable region 30 is formed by ion implantation an n-type or p-type dopant, as defined above. The second programmable region 30 is composed of a doped semiconductor that includes a same semiconductor material as the second semiconductor material layer 18L and an n-type or p-type dopant as defined above. The conductivity type of dopant present in the second programmable region 30 may be the same as, or different from, the conductivity type dopant present in the second programmable region 28.

The concentration of n-type or p-type dopant that is present in the second programmable region 30 that is formed in the second semiconductor layer 18L determines whether the threshold voltage of the resultant programmable semiconductor fin portion that contains the second programmable region 30 is less than 0, or greater than 0, and therefore the whether resultant programmable semiconductor fin portion that contains the second programmable region 30 can be programmed to have a value of "0" or "1". See, the above description for the concentration of n-type dopants for the first programmable region 22, which are applicable here for the second programmable region 30. The second programmable region 30 can be programmed the same as, or different from, the second programmable region 28 formed in the first semiconductor material layer 14L. In one embodiment, the second programmable region 30 can be used to provide a programmable semiconductor fin portion that can be programmed "0".

Figure 6:
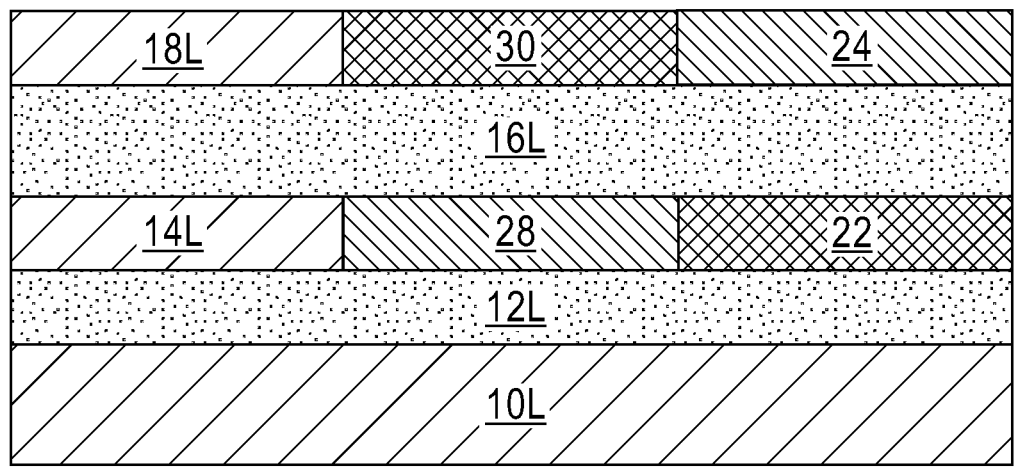
FIG. 6 is a cross sectional view of the exemplary semiconductor structure of FIG. 5 removing the second mask.

Referring now to FIG. 6, there is illustrated the exemplary semiconductor structure of FIG. 5 removing the second mask 26. The second mask 26 is removed utilizing any material removal process such as, for example, chemical mechanical polishing, etching or ashing. At this point of the present application, additional programmable regions can be formed in the both the first and second semiconductor material layers 14L and 18L by forming a mask, ion implantation, and removing the mask. In one example, third programmable regions can be formed in the first and second semiconductor material layers 14L and 18L that can be used to provide semiconductor fin portions that can be both programmed as "0", and fourth programmable regions can be formed in the first and second semiconductor material layers 14L and 18L that can be used to provide semiconductor fin portions that can be both programmed as "1". It should be noted that any number of programmable regions can be formed into the first and second semiconductor material layers.

Figure 7A:
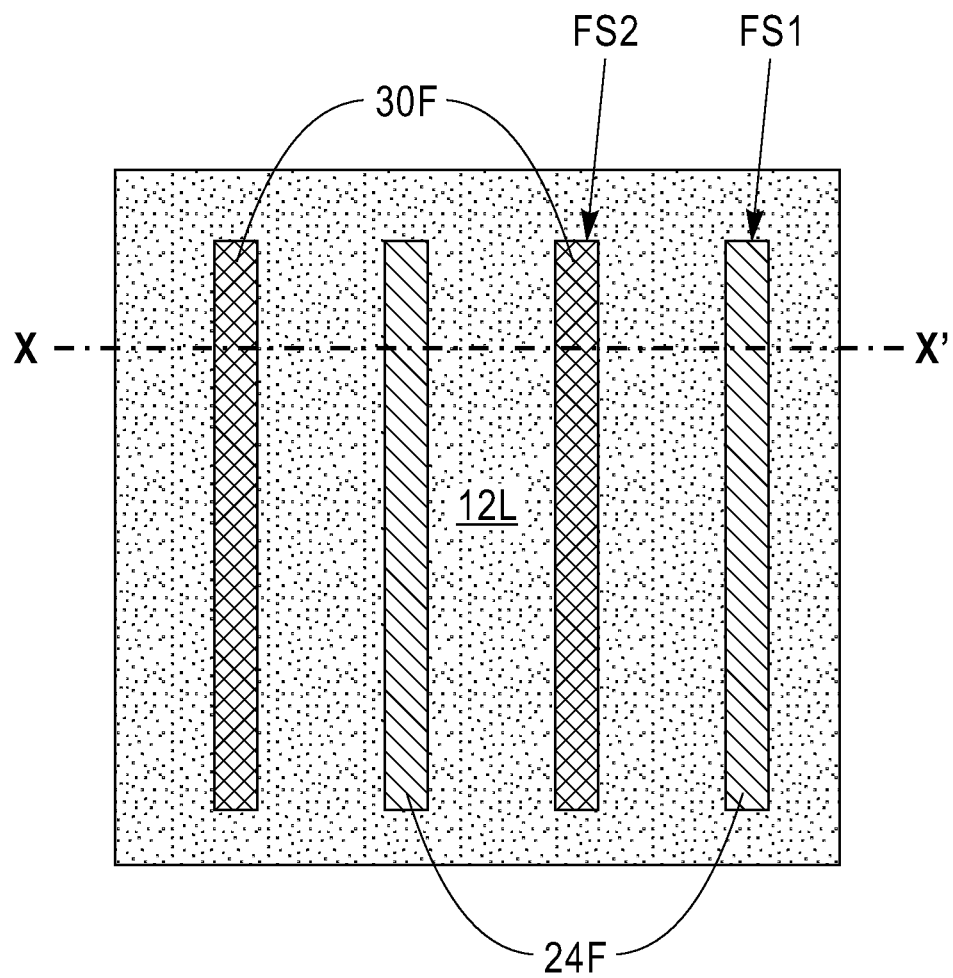
FIG. 7A is a top down view of the exemplary semiconductor structure of FIG. 6 after forming additional programmable regions in both the first and second semiconductor material layers, and thereafter forming a plurality of fin structures extending upward from the first insulator layer, wherein each fin structure includes a bottom programmable semiconductor fin portion, an insulator fin portion, and an upper programmable semiconductor fin portion.
Figure 7B:
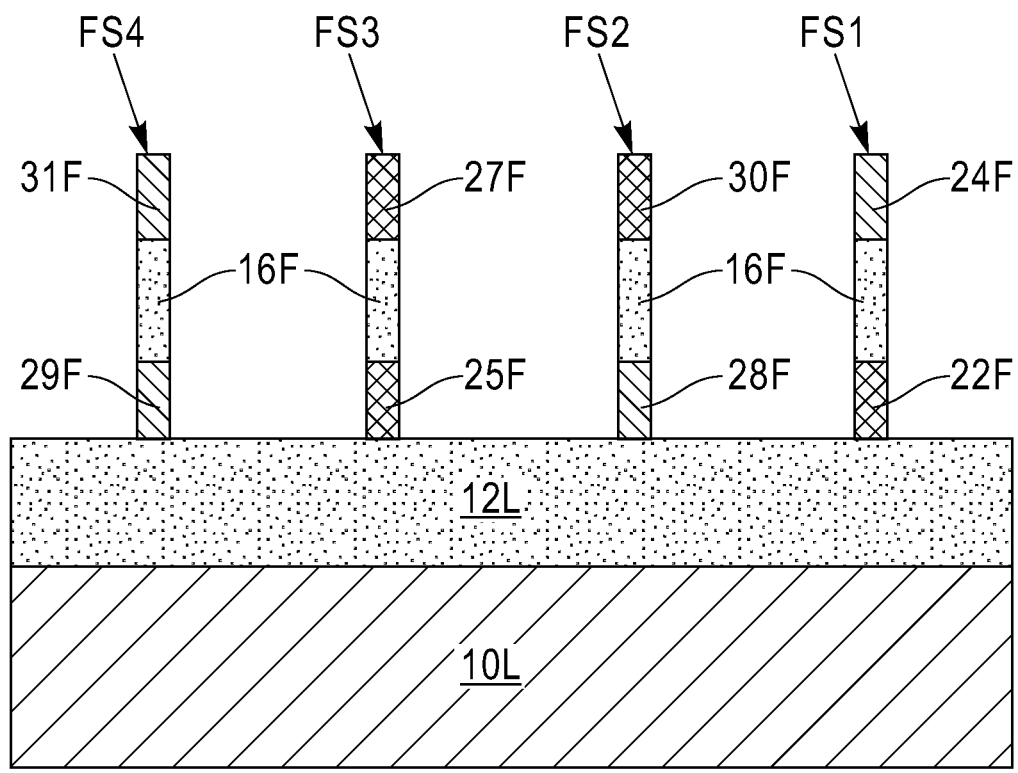
FIG. 7B is a cross sectional view of the exemplary semiconductor structure of FIG. 7A through line X-X'.

Referring now to FIGS. 7A-7B there are illustrated the exemplary semiconductor structure of FIG. 6 after forming additional programmable regions in the first and second semiconductor material layers, and thereafter forming a plurality of fin structures (e.g., FS1, FS2, FS3 and FS4) extending upward from the first insulator layer 12. Each fin structure (e.g., FS1, FS2, FS3 and FS4) includes a bottom programmable semiconductor fin portion having a first threshold voltage, an insulator fin portion, and an upper programmable semiconductor fin portion having a second threshold voltage. The first and second threshold voltages may be the same, or different from each other; see the above description regarding dopant concentrations which are used in the present application to provide a threshold voltage to the semiconductor fin portions.

In the present application, FS1 denotes a first fin structure, FS2 denotes a second fin structure, FS3 denotes a third fin structure, and FS4 denotes a fourth fin structure. Although four fin structures are described and illustrated, the present application is not limited to forming four fin structures. Instead, the present application contemplates embodiments in which less than four fin structures (i.e., 1 fin structure to 3 fin structures) or greater than four fin structures are formed.

Each fin structure (e.g., FS1, FS2, FS3, and FS4) that is formed is orientated parallel to each other. Each fin structure (e.g., FS1, FS2, FS3, and FS4) has a same vertical height, width and length. Each fin structure (e.g., FS1, FS2, FS3, and FS4) will be processed to include a lower gate structure that contacts a sidewall of the lower programmable semiconductor fin portion and an upper gate structure that contacts a sidewall of the upper programmable semiconductor fin portion. A portion of the lower gate structure may contact a lower portion of a sidewall of the insulator fin portion 16F, and a portion of the upper gate structure may contact an upper portion of the sidewall of the insulator fin portion 16F. The lower and upper gate structures will be stacked one atop the other.

The term "fin structure" is used in the present application to define a structure that is composed of a lower programmable semiconductor material and an upper programmable semiconductor material that are vertically separated from each other by an insulator material, and including a pair of vertical sidewalls that are parallel to each other. A surface is "vertical" if there exists a vertical plane from which the surface does not deviate by more than three times the root mean square roughness of the surface. In one embodiment, each fin structure (e.g., FS1, FS2, FS3, and FS4) has a vertical height from 20 nm to 300 nm, a width from 5 nm to 30 nm, and a length from 20 nm to 300 nm. Other vertical heights and/or widths and/or lengths that are lesser than, or greater than, the ranges mentioned herein can also be used in the present application.

In one embodiment of the present application, FS1 includes a bottom programmable semiconductor fin portion 22F (i.e., a remaining, non-etched portion of the first programmable region 22) having a first threshold voltage and that can be programmed as "0", an insulator fin portion 16F (i.e., a remaining, non-etched portion of the second insulator layer 16L), and an upper programmable semiconductor fin portion 24F (i.e., a remaining, non-etched portion of the first programmable region 24) having a second threshold voltage, different from the first threshold voltage, and that can be programmed as "1". In such an embodiment, FS2 includes a bottom programmable semiconductor fin portion 28F (i.e., a remaining, non-etched portion of the second programmable region 28) having a first threshold voltage and that can be programmed as "1", an insulator fin portion 16F (i.e., a remaining, non-etched portion of the second insulator layer 16L), and an upper programmable semiconductor fin portion 30F (i.e., a remaining, non-etched portion of the second programmable region 30) having a second threshold voltage, different from the first threshold voltage, and that can be programmed as "0".

In addition to FS1 and FS2, and in this one embodiment, FS3 includes a bottom programmable semiconductor fin portion 25F (i.e., a remaining, non-etched portion of a third programmable region that is formed into the first semiconductor layer 14L) having a first threshold voltage and that can be programmed as "0", an insulator fin portion 16F (i.e., a remaining, non-etched portion of the second insulator layer 16L), and an upper programmable semiconductor fin portion 27F (i.e., a remaining, non-etched portion of a third programmable region that is formed in the second semiconductor layer 18L) having a second threshold voltage that equals the first threshold voltage and that can be programmed as "0".

In addition to FS1, FS2, and FS3, and in this one embodiment, FS4 includes a bottom programmable semiconductor fin portion 29F (i.e., a remaining, non-etched portion of a fourth programmable region that is formed into the first semiconductor layer 14L) having a firth threshold voltage that can be programmed as "1", an insulator fin portion 16F (i.e., a remaining, non-etched portion of the second insulator layer 16L), and an upper programmable semiconductor fin portion 31F (i.e., a remaining, non-etched portion of a fourth programmable region that is formed in the second semiconductor layer 18L) having a second threshold voltage that equals the first threshold voltage and that can be programmed as "1".

The plurality of fin structures (e.g., FS1, FS2, FS3, and FS4) can be formed by patterning the material stack shown in FIG. 6 including the various programmable regions 22, 24, 28, 30, etc. The patterning stops on a topmost surface of the first insulator layer 12L. Patterning may be performed by lithography and etching, a sidewall image transfer (SIT) process or by a direct self-assembly (DSA) process in which a copolymer that is capable of direct self-assembly is used. Such patterning processes are well known to those skilled in the art therefore the details of each of the aforementioned patterning processes has be omitted so as not to obscure the method of the present application.

Figure 8:
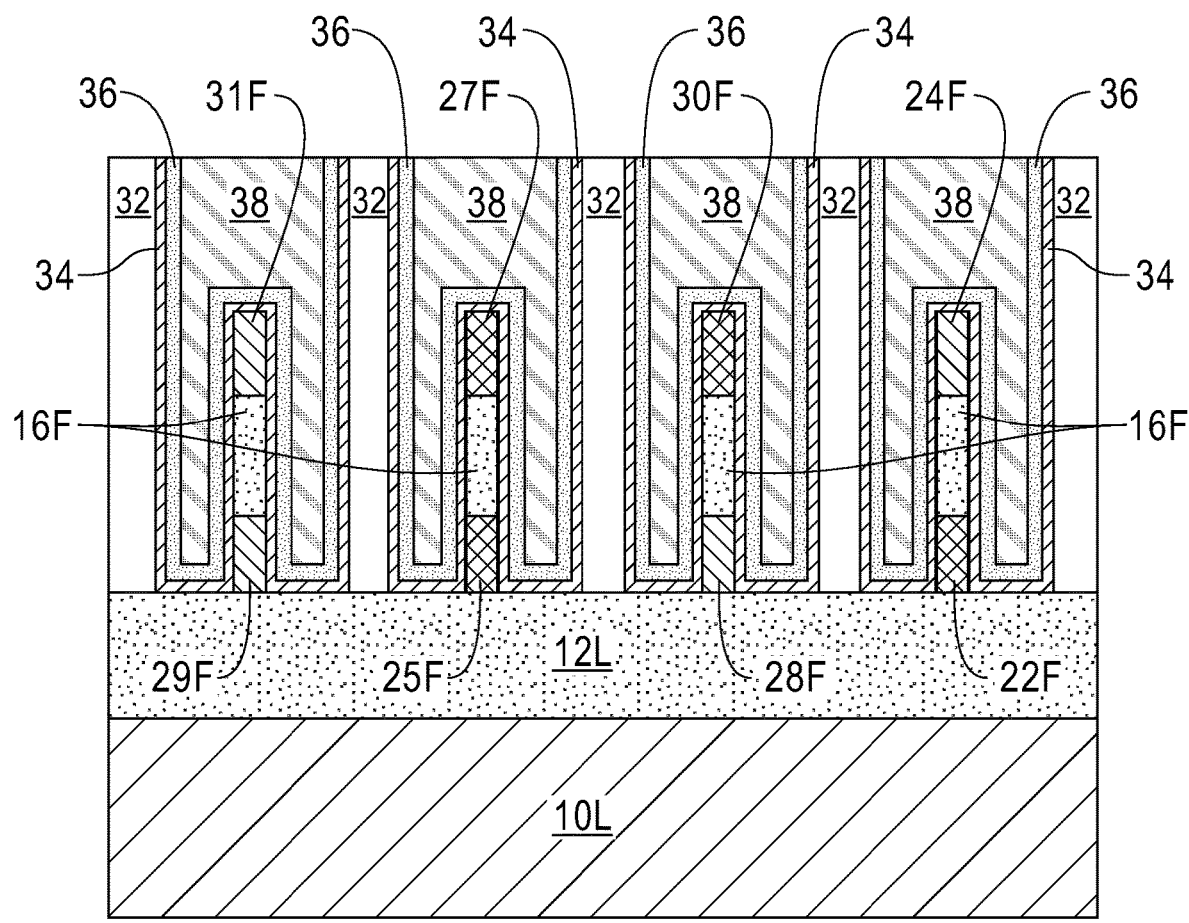
FIG. 8 is a cross sectional view of the exemplary semiconductor structure of FIG. 7A after forming an interlayer dielectric (ILD) material with gate openings that physically expose each of the fin structures, and forming a first gate structure in each of the gate openings.

Referring now to FIG. 8, there is illustrated the exemplary semiconductor structure of FIG. 7A after forming an interlayer dielectric (ILD) material 32 with gate openings (not shown) that physically expose each of the fin structures (e.g., FS1, FS2, FS3 and FS4), and forming a first gate structure (34, 36, 38) in each of the gate openings. The first gate structure may be an nFET or a pFET.

The ILD material 32 containing the gate openings can be formed by first depositing a blanket layer of the ILD material 32 and thereafter lithographically patterning the blanket layer of ILD material 32. Each gate opening physically exposes one of the fin structures (e.g., FS1, FS2, FS3 and FS4). The ILD material 32, which is formed in the space, i.e., gap, between each of the fin structures and atop each of fin structures, is composed of a dielectric material that is compositionally different from the dielectric material of the first and second insulator layers 12L and 16L. Examples of dielectric materials that can be used as the ILD material 32 include undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0 (all dielectric constants mentioned in the present application are measured in a vacuum unless otherwise noted). In one embodiment, the blanket layer of ILD material 32 can be formed by a deposition process such as, for example, chemical vapor deposition (CVD), plasma enhanced chemical vapor deposition (PECVD), evaporation or spin-on coating.

The first gate structure (34, 36, 38) that is formed in each of the gate openings includes a first gate dielectric material layer 34, a first work function setting layer 36, and a first gate electrode layer 38.

The first gate dielectric material layer 34 is composed of a gate dielectric material such as, for example, an oxide, nitride, and/or oxynitride. In one example, the first gate dielectric material layer 34 can be composed of a high-k material having a dielectric constant greater than 4.0. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the first gate dielectric material layer 34. In one embodiment, the first gate dielectric material layer 34 can have a thickness in a range from 1 nm to 10 nm. Other thicknesses that are lesser than, or greater than, the aforementioned thickness range can also be employed for the first gate dielectric material layer 34.

The first work function setting layer 36 includes any suitable work function metal (WFM) containing material. Illustrative examples of WFM containing materials that can be employed as the first work function setting layer 36 include, but are not limited to, a nitride, such as, for example, titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN), a carbide, such as, for example, titanium carbide (TiC), titanium aluminum carbide (TiAlC), tantalum carbide (TaC), hafnium carbide (HfC), and combinations thereof. In one embodiment, the first work function setting layer 36 may provide a threshold voltage to the first gate structure that is less than 0. In another embodiment, the first work function setting layer 36 may provide a threshold voltage to the first gate structure that is greater than 0. In one embodiment, the first work function setting layer 36 can have a thickness in a range from 20 nm to 50 nm. Other thicknesses that are lesser than, or greater than, the aforementioned thickness range can also be employed for the first work function setting layer 36.

The gate electrode layer 38 may be composed of a conductive material such as, for example, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g., $Ti_3Al$, ZrAl), TaC, TaMgC, carbon nanotube, conductive carbon, graphene, or any suitable combination of these materials. The conductive material may further comprise dopants that are incorporated during or after deposition.

The first gate structure (34, 36, 38) can be formed by sequentially depositing the first gate dielectric material layer 34, the first work function setting layer 36, and the first gate electrode layer 38 into each of the gate openings provided in the ILD material 32. A planarization process such as, for example, chemical mechanical polishing (CMP) and/or grinding may follow the sequential deposition processes to remove any material from the topmost surface of the ILD material 32. At this point of the present application, the first gate structure (34, 36, 38) is located on the entirety of the physically exposed portion of each fin structure (e.g., FS1, FS2, FS3 and FS4) including along the sidewalls of the lower programmable semiconductor fin portion the sidewall of the insulator fin portion 16F, and the sidewalls and topmost surface of the upper programmable fin portion of each fin structure.

Figure 9:
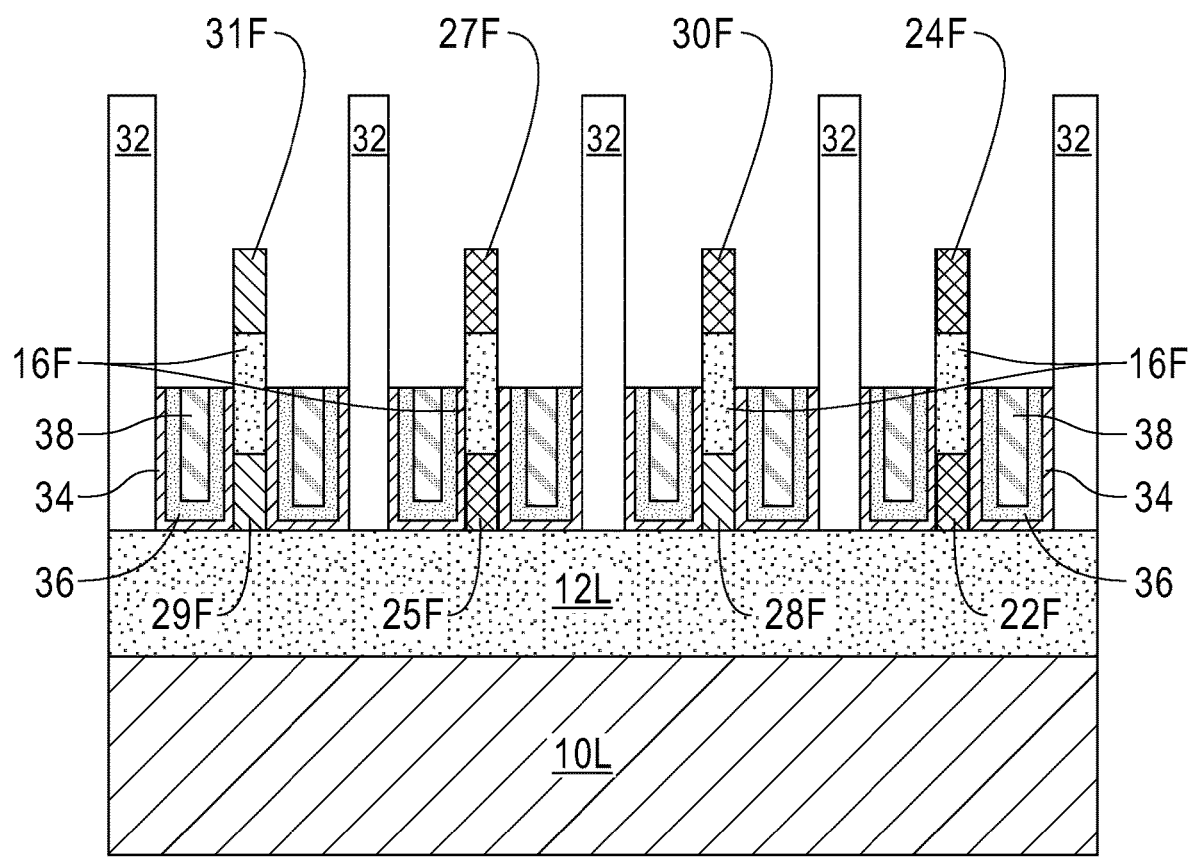
FIG. 9 is a cross sectional view of the exemplary semiconductor structure of FIG. 8 after removing the first gate structure from the upper programmable semiconductor fin portion of each fin structure.

Referring now to FIG. 9, there is illustrated the exemplary semiconductor structure of FIG. 8 after removing the first gate structure (34, 36, 38) from the upper programmable semiconductor fin portion (e.g., 24F, 30F, 27F and 31F) of each fin structure (e.g., FS1, FS2, FS3 and FS4). As is shown, the first gate structure (34, 36, 38) is maintained on a sidewalls of the lower programmable semiconductor fin portion of each fin structure (e.g., FS1, FS2, F3 and FS4). As is further shown, a portion of the first gate structure (34, 36, 38) may remain on a lower portion of the insulator fin portion 16F of each fin structure (e.g., FS1, FS2, FS3 and FS4).

The removal of the first gate structure (34, 36, 38) from the upper programmable semiconductor fin portion of each fin structure (e.g., FS1, FS2, FS3 and FS4) s may be performed utilizing one or more recess etching processes which are selective in removing the first gate structure (34, 36, 38) from the upper programmable semiconductor fin portion of each fin structure (e.g., FS1, FS2, FS3 and FS4).

Figure 10:
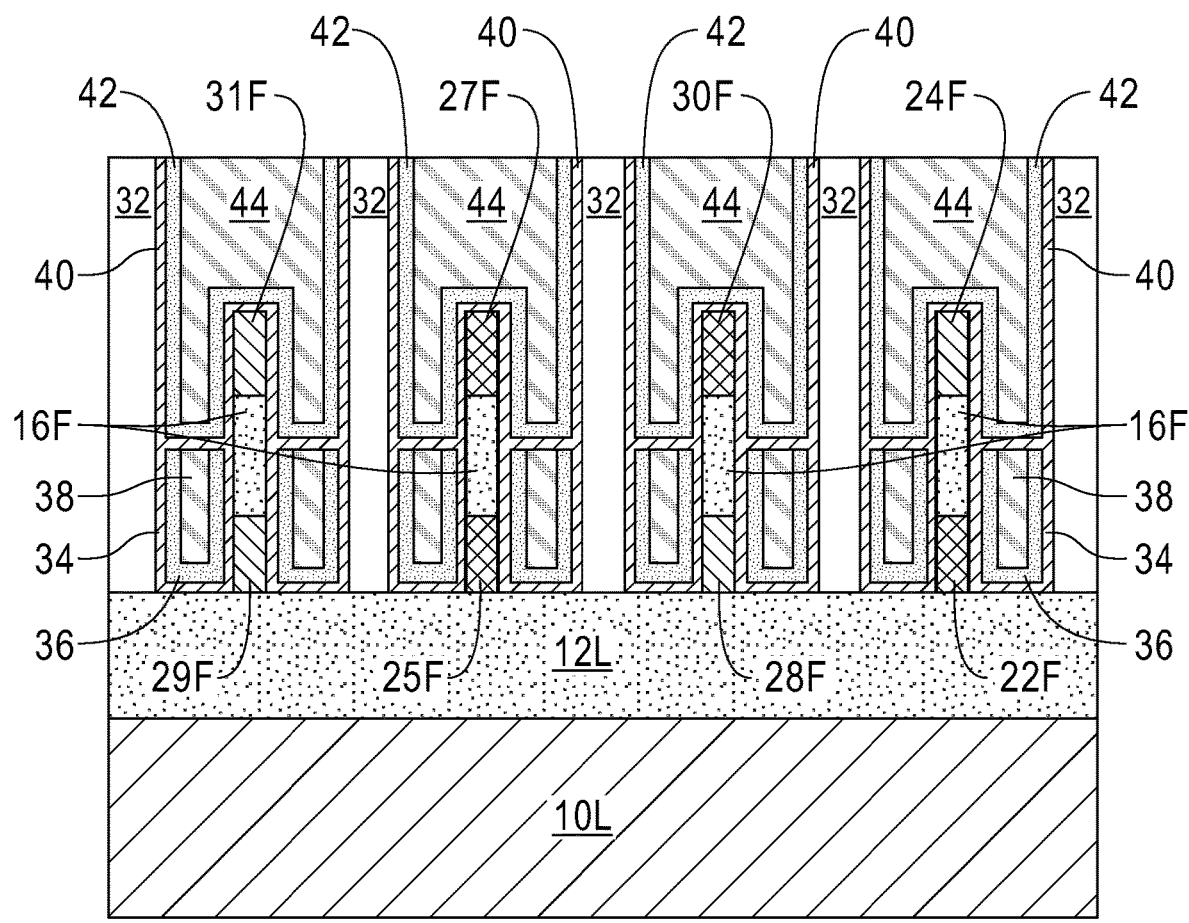
FIG. 10 is a cross sectional view of the exemplary semiconductor structure of FIG. 9 after forming a second gate structure contacting the physically exposed upper programmable semiconductor fin portion of each fin structure, and atop the remaining first gate structure that contacts the lower programmable semiconductor fin portion of each fin structure.

Referring now to FIG. 10, there is illustrated the exemplary semiconductor structure of FIG. 9 after forming a second gate structure (40, 42, 44) contacting the physically exposed upper programmable semiconductor fin portion of each fin structure (e.g., FS1, FS2, FS3 and F4), and atop the remaining first gate structure (34, 36, 38) that contacts the lower programmable semiconductor fin portion of each fin structure (e.g., FS1, FS2, FS3 and FS4). In the present application, the first gate structure may be referred to as a lower gate structure, while the second gate structure may be referred to as a n upper gate structure. The second gate structure has an opposite conductivity than the first gate structure. In one embodiment, the second gate structure is an nFET gate structure, and the first gate structure is a pFET gate structure. In another embodiment, the second gate structure is a pFET gate structure, and the first gate structure is an nFET gate structure.

The second gate structure (40, 42, 44) includes a second gate dielectric material layer 40, a second work function setting layer 42, and a second gate electrode layer 44. Since the second gate structure (40, 42, 44) is formed above the first gate structure (34, 36, 38), the second gate structure (40, 42, 44) may be referred to as an upper (or top) gate structure, while the first gate structure (34, 36, 28) may be referred to a lower (or bottom) gate structure. A portion of the second gate structure (40, 42, 44) may extend onto a sidewall of the insulator fin portion 16F of each fin structure (e.g., FS1, FS2, FS3 and FS3).

The second gate dielectric material layer 40 may include one of the gate dielectric materials mentioned above for the first gate dielectric material layer 34. In one embodiment, the second gate dielectric material layer 40 is composed of a same gate dielectric material as the first gate dielectric material layer 34. In another embodiment, the second gate dielectric material layer 40 is composed of a compositionally different gate dielectric material than the first gate dielectric material layer 34. The second gate dielectric material layer 40 may have a thickness within the range mentioned above for the first gate dielectric material layer 34.

The second work function setting layer 42 may be selected from one of the work function metal containing materials mentioned above for the first work function setting layer 36. The second work function setting layer 42 is typically compositionally different from the first work function setting layer 36.

The second gate electrode layer 44 may include one of the conductive materials mentioned above for the first gate electrode layer 38. In one embodiment, the second gate electrode layer 44 is composed of a same conductive material as the first gate electrode layer 38. In another embodiment, the second gate electrode layer 44 is composed of a compositionally different conductive material than the first gate electrode layer 38.

The second gate structure (40, 42, 44) can be formed utilizing the technique mentioned above in forming the first gate structure (34, 36, 38). The second gate structure (40, 42, 44) has a topmost surface that is coplanar with a topmost surface of the ILD material 32.

At this point of the present application, a bottom source/drain structure (not shown) can be epitaxially grown from physically exposed surfaces of each lower programmable semiconductor fin portion, and a top source/drain structure (not shown) can be epitaxially grown from physically exposed surfaces of each upper programmable semiconductor fin portion. The top and bottom source/drain structures are not merged with each other. The top and bottom source/drain structures are composed of a semiconductor material and an n-type dopant or a p-type dopant as are well known to those skilled in the art.

FIG. 10 illustrates a stacked FinFET mask-programmable ROM array that can be provided. Although the array is shown with four stacked FinFET mask-programmable ROM memories, the present application contemplates embodiments in which less than four (one, two or three) stacked FinFET mask-programmable ROM memories are utilized. In some embodiments, greater than four stacked FinFET mask-programmable ROM memories can be formed. The stacked FinFET mask-programmable ROM memories may include any combination of programmable values "1" and/or "0".

In one embodiment and as shown in FIG. 10, the array includes a first stacked FinFET mask-programmable ROM memory that includes a first fin structure, FS1, extending upward from an insulator layer 12L, wherein the first fin structure, FS1, comprises, from bottom to top, a lower programmable semiconductor fin portion 22F programmed as "0", an insulator fin portion 16F, and an upper programmable semiconductor fin portion 24F programmed as "1", a first lower gate structure (34, 36, 38) contacting a sidewall of the lower programmable semiconductor fin portion 22F of the first fin structure, FS1, and a first upper gate structure (40, 42, 44) contacting a sidewall of the second programmable semiconductor fin portion 24F of the first fin structure, FS1.

The array further includes a second stacked FinFET mask-programmable ROM memory that includes a second fin structure, FS2, extending upward from the insulator layer 12L, wherein the second fin structure, FS2, comprises, from bottom to top, a lower programmable semiconductor fin portion 28F programmed as "1", an insulator fin portion 16F, and an upper programmable semiconductor fin portion 30F programmed as "0", a second lower gate structure (34, 36, 38) contacting a sidewall of the lower programmable semiconductor fin portion 28F of the second fin structure, FS2, and a second upper gate structure (40, 42,44) contacting a sidewall of the second programmable semiconductor fin portion, 30F, of the second fin structure, FS2.

The array further includes a third stacked FinFET mask-programmable ROM memory that includes a third fin structure, FS3, extending upward from the insulator layer 12L, wherein the third fin structure, FS3, comprises, from bottom to top, a lower programmable semiconductor fin portion 25F programmed as "0", an insulator fin portion 16F, and an upper programmable semiconductor fin portion 27F programmed as "0", a third lower gate structure (34, 36, 38) contacting a sidewall of the lower programmable semiconductor fin portion 25F of the third fin structure, FS3, and a third upper gate structure (40, 42, 44) contacting a sidewall of the second programmable semiconductor fin portion 27F of the third fin structure, FS3.

The array also includes a fourth stacked FinFET mask-programmable ROM memory that includes a fourth fin structure, FS4, extending upward from the insulator layer 12L, wherein the fourth fin structure, FS4, comprises, from bottom to top, a lower programmable semiconductor fin portion 29F programmed as "1", an insulator fin portion 16F, and an upper programmable semiconductor fin portion 31F programmed as "1", a fourth lower gate structure (34, 36, 38) contacting a sidewall of the lower programmable semiconductor fin portion 29F of the fourth fin structure, FS4, and a fourth upper gate structure (40, 42, 44) contacting a sidewall of the second programmable semiconductor fin portion, 31F, of the fourth fin structure, FS4.

Figure 11:
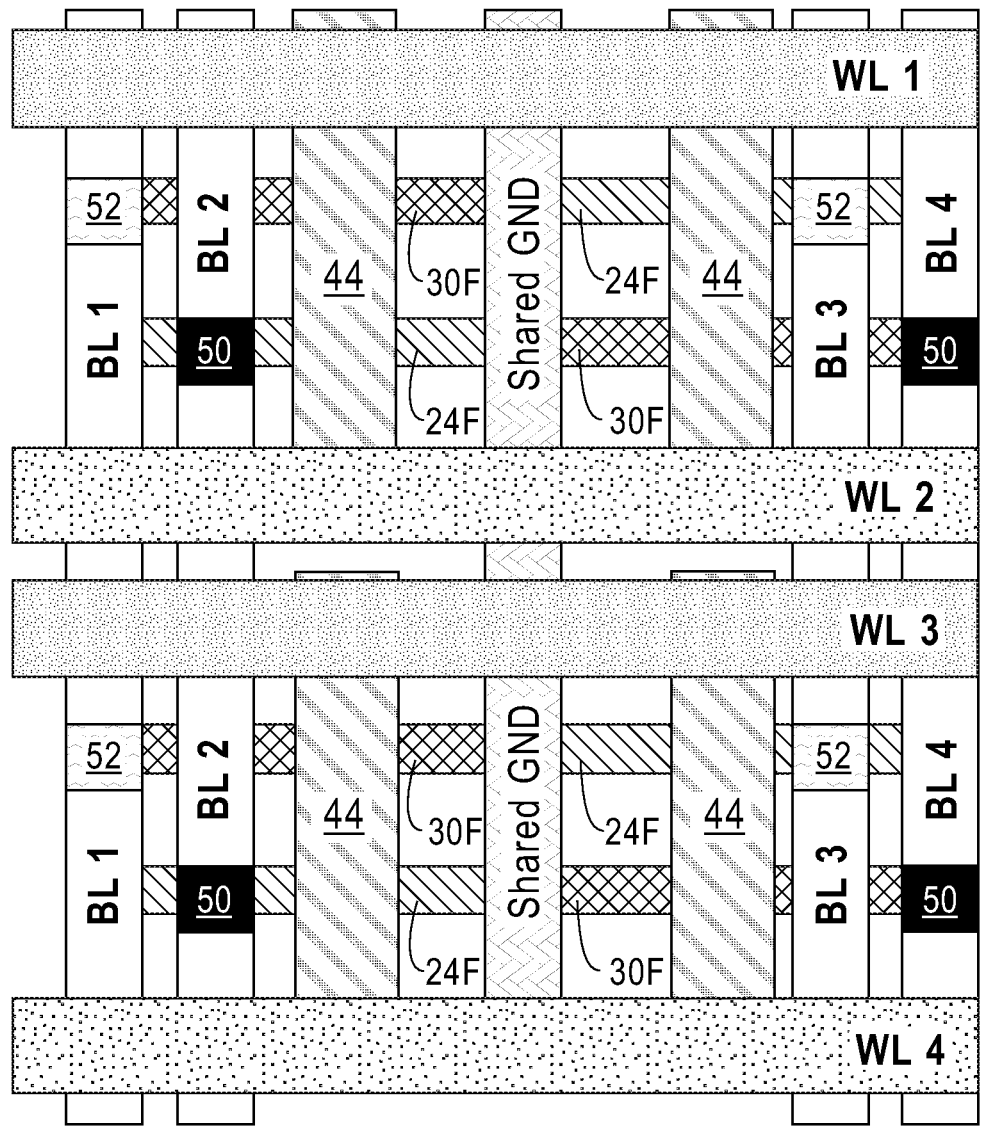
FIG. 11 is a top down view showing an exemplary structure of the present application after contact formation and metallization.

Referring now to FIG. 11, there is illustrated an exemplary structure of the present application after contact formation and metallization. The top-down view illustrated in FIG. 11 only shows a portion of the exemplary structure shown in FIG. 10. For simplicity, the gate dielectric material layers, the work function setting layers and the ILD material are not shown. Contact formation includes forming top source/drain contacts 50 which contact a surface of the top source/drain structure and bottom source/drain contacts 52 which contact a surface of the bottom source/drain structure. The top and bottom contacts 50 and 52 are composed of any well known contact metal or metal alloy and they are formed utilizing techniques that are well known to those skilled in the art. The structure shown in FIG. 11 further includes wordlines, WL 1, WL 2, WL3 and W4, that run perpendicular to each fin structure, and bitlines, BL 1, BL 2, BL3 and BL4, that run parallel to the bitlines and each fin structure. The wordlines and bitlines are composed of conventional conductive materials and can be formed utilizing techniques well known to those skilled in the art. The structure further includes a shared ground (GND), which includes a conventional conductive material and can be formed utilizing techniques well known to those skilled in the art.

Figure 12A:
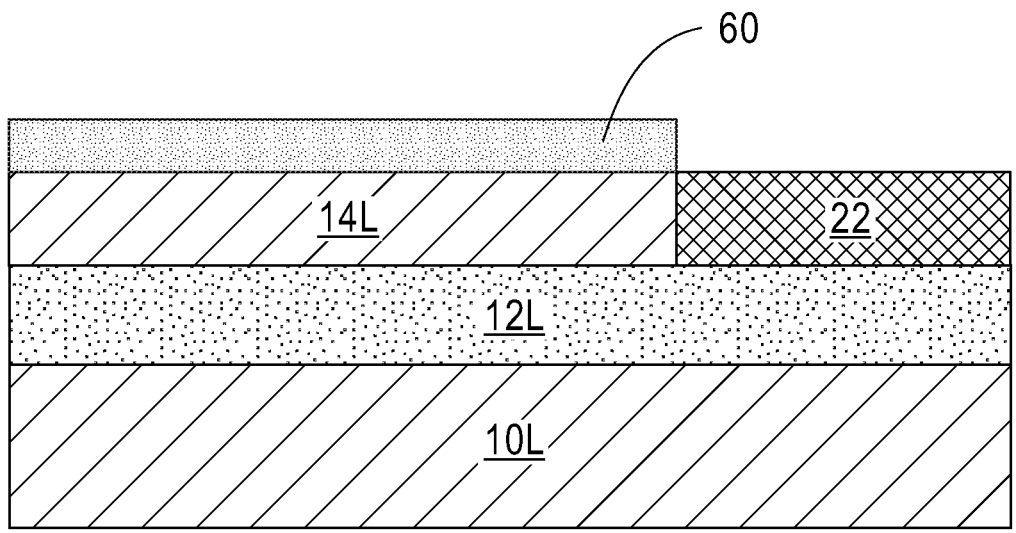
FIGS. 12A-12E are cross sectional views illustrating an alternative embodiment for forming the exemplary structure shown in FIG. 6.

Referring now to FIGS. 12A-12E, there are illustrated an alternative embodiment for forming the exemplary structure shown in FIG. 6. Reference is first made to FIG. 12A, wherein a first structure that can be employed in accordance with this alternative embodiment is illustrated. The first structure includes a semiconductor substrate 10L, as defined above, insulator layer 12L as defined above, and a first semiconductor material layer 14L as defined above, wherein the first semiconductor material layer 14L includes a first programmable region 22, as defined above disposed therein. The first programmable region 22 can be formed by ion implantation, as defined above, utilizing mask 60 as an ion implantation mask.

Figure 12B:
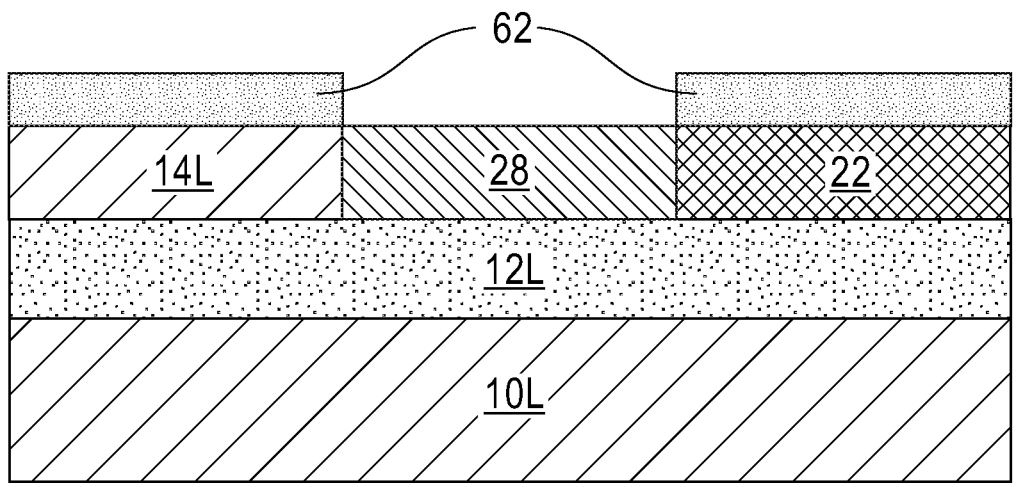

Referring now to FIG. 12B, there is illustrated the first structure of FIG. 12A after removing mask 60, forming a second mask 62 and thereafter forming a second programmable region 28, as defined above, in another portion of the first semiconductor material layer 14L by ion implantation. Additional programmable regions can be formed in the first semiconductor material layer 14L by using masking and ion implantation.

Figure 12C:
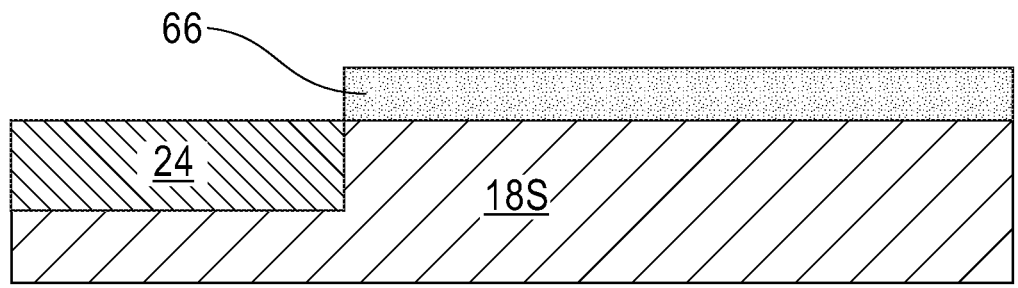

Referring now to FIG. 12C, there is shown a second structure that can be used in this alternative embodiment of the present application. The first and second structures can be formed in any order. The second structure includes a second semiconductor material layer 18L, as defined above, having a first programmable region 24, as defined above, disposed therein. The first programmable region 24 can be formed by ion implantation, as defined above, utilizing mask 66 as an ion implantation mask.

Figure 12D:
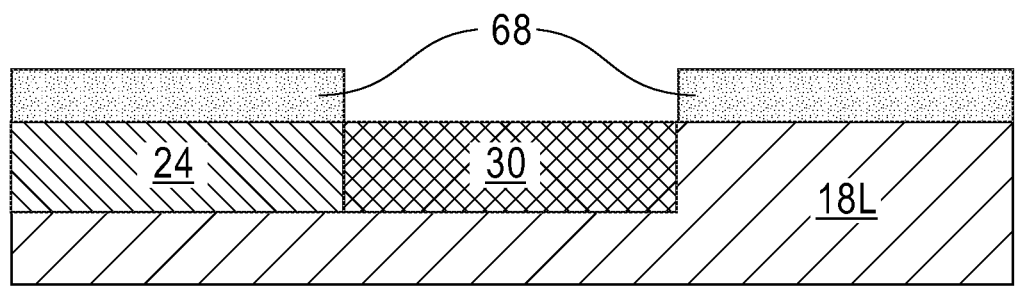
Figure 12E:
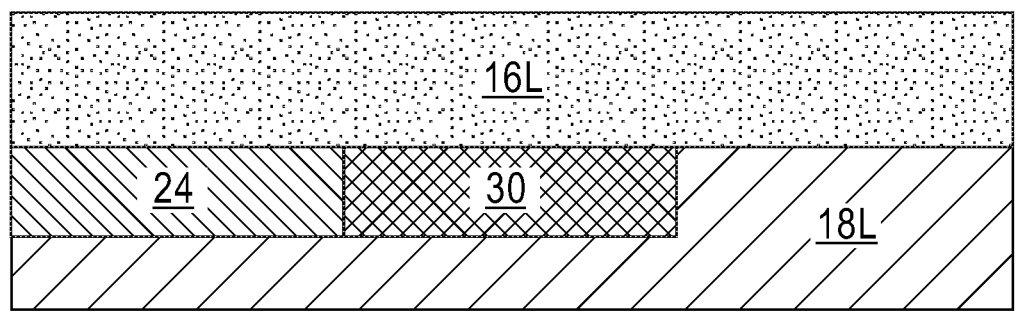

Referring now to FIG. 12D, there is illustrated the first structure of FIG. 12C after removing mask 66, forming a second mask 68 and thereafter forming a second programmable region 30, as defined above, in another portion of the second semiconductor material layer 18L by ion implantation. Additional programmable regions can be formed in the second semiconductor material layer 18L by using masking and ion implantation.

Referring now to 12E, there is illustrated the structure of FIG. 12D after forming second insulator layer 16L, as defined above, on a physically exposed surface of the second semiconductor material layer 18L including the various programmable regions. The insulator layer 16L can be formed utilizing any conventional deposition process.

As this point of the present, the second structure can be flipped 180°, and a polishing process can be used to remove the second semiconductor material layer 18L that is located above each programmable region that is present in the second semiconductor layer 18L. The process continues by bonding the second insulator layer 16L of the second structure to the first semiconductor layer 14L of the first structure to provide a material stack as shown in FIG. 6.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A stacked FinFET mask-programmable read only memory (ROM) comprising:
   a fin structure extending upward from an insulator layer, wherein the fin structure comprises, from bottom to top, a lower programmable semiconductor fin portion having a first threshold voltage that is determined by a dopant concentration of the lower programmable semiconductor fin portion, an insulator fin portion, and an upper programmable semiconductor fin portion having a second threshold voltage that is determined by a dopant concentration of the upper programmable semiconductor fin portion;
   a lower gate structure contacting a sidewall of the lower programmable semiconductor fin portion, wherein the lower gate structure comprises a first gate dielectric material layer, a first work function setting layer, and a first gate electrode layer; and
   an upper gate structure contacting a sidewall of the upper programmed semiconductor fin portion, wherein the upper gate structure comprises a second gate dielectric material layer, a second work function setting layer, and a second gate electrode layer, and wherein the second gate dielectric material layer of the upper gate structure has a horizontal portion that is located directly on an upper surface of both the first work function setting layer and the first gate electrode layer of the lower gate structure, and the horizontal portion of the second gate dielectric material layer of the upper gate structure separates the second work function metal layer of the upper gate structure from both the first work function setting layer and the first gate electrode layer of the lower gate structure.

2. The stacked FinFET mask-programmable ROM of claim 1, wherein the first and second threshold voltages are the same.

3. The stacked FinFET mask-programmable ROM of claim 2, wherein the lower programmable semiconductor fin portion and the upper programmable semiconductor fin portion are programmed to have a same value.

4. The stacked FinFET mask-programmable ROM of claim 3, wherein the lower programmable semiconductor fin portion and the upper programmable semiconductor fin portion are both programmed as "0".

5. The stacked FinFET mask-programmable ROM of claim 3, wherein the lower programmable semiconductor fin portion and the upper programmable semiconductor fin portion are both programmed as "1".

6. The stacked FinFET mask-programmable ROM of claim 1, wherein the first threshold voltage is different from the second threshold voltage.

7. The stacked FinFET mask-programmable ROM of claim 6, wherein the lower programmable semiconductor fin portion and the upper programmable semiconductor fin portion are programmed to have a different value.

8. The stacked FinFET mask-programmable ROM of claim 7, wherein the lower programmable semiconductor fin portion is programmed "0" and the upper programmable semiconductor fin portion are both programmed as "1".

9. The stacked FinFET mask-programmable ROM of claim 7, wherein the lower programmable semiconductor fin portion is programmed "1" and the upper programmable semiconductor fin portion is programmed as "0".

10. The stacked FinFET mask-programmable ROM of claim 1, wherein a portion of the lower gate structure contacts a lower portion of a sidewall of the insulator fin portion, and a portion of the upper gate structure contacts an upper portion of the sidewall of the insulator fin portion, and the lower and upper gate structures are in direct physical contact with each other.

11. The stacked FinFET mask-programmable ROM of claim 1, further comprising an interlayer dielectric material laterally located laterally adjacent to the lower and upper gate structures.

12. A stacked FinFET mask-programmable read only memory (ROM) array comprising:
   a first stacked FinFET mask-programmable ROM memory comprising a first fin structure extending upward from an insulator layer, wherein the first fin structure comprises, from bottom to top, a lower programmable semiconductor fin portion programmed as "0", an insulator fin portion, and an upper programmable semiconductor fin portion programmed as "1", a first lower gate structure contacting a sidewall of the lower programmable semiconductor fin portion of the first fin structure, and a first upper gate structure contacting a sidewall of the second programmable semiconductor fin portion of the first fin structure;
   a second stacked FinFET mask-programmable ROM memory comprising a second fin structure extending upward from the insulator layer, wherein the second fin structure comprises, from bottom to top, a lower programmable semiconductor fin portion programmed as "1", an insulator fin portion, and an upper programmable semiconductor fin portion programmed as "0", a second lower gate structure contacting a sidewall of the lower programmable semiconductor fin portion of the second fin structure, and a second upper gate structure contacting a sidewall of the second programmable semiconductor fin portion of the second fin structure;
   a third stacked FinFET mask-programmable ROM memory comprising a third fin structure extending upward from the insulator layer, wherein the third fin structure comprises, from bottom to top, a lower programmable semiconductor fin portion programmed as "0", an insulator fin portion, and an upper programmable semiconductor fin portion programmed as "0", a third lower gate structure contacting a sidewall of the lower programmable semiconductor fin portion of the third fin structure, and a third upper gate structure contacting a sidewall of the second programmable semiconductor fin portion of the third fin structure; and
   a fourth stacked FinFET mask-programmable ROM memory comprising a fourth fin structure extending upward from the insulator layer, wherein the fourth fin structure comprises, from bottom to top, a lower programmable semiconductor fin portion programmed as "1", an insulator fin portion, and an upper programmable semiconductor fin portion programmed as "1", a fourth lower gate structure contacting a sidewall of the lower programmable semiconductor fin portion of the fourth fin structure, and a fourth upper gate structure contacting a sidewall of the second programmable semiconductor fin portion of the fourth fin structure, wherein each lower gate structure comprises a first gate dielectric material layer, a first work function setting layer, and a first gate electrode layer, and each upper gate structure comprises a second gate dielectric material layer, a second work function setting layer, and a second gate electrode layer, and wherein the second gate dielectric material layer of each upper gate structure has a horizontal portion that is located directly on an upper surface of both the first work function setting layer and the first gate electrode layer of each lower gate structure, and the horizontal portion of the second gate dielectric material layer of each upper gate structure separates the second work function metal layer of each upper gate structure from both the first work function setting layer and the first gate electrode layer of each lower gate structure.

13. A method of forming a stacked FinFET mask-programmable read only memory (ROM), the method comprising:
   forming a fin structure extending upward from an insulator layer, wherein the fin structure comprises, from bottom to top, a lower programmable semiconductor fin portion having a first threshold voltage that is determined by a dopant concentration of the lower programmable semiconductor fin portion, an insulator fin portion, and an upper programmable semiconductor fin portion having a second threshold voltage that is determined by a dopant concentration of the upper programmable semiconductor fin portion;
   forming a lower gate structure contacting a sidewall of the lower programmable semiconductor fin portion, wherein the lower gate structure comprises a first gate dielectric material layer, a first work function setting layer, and a first gate electrode layer; and forming an upper gate structure contacting a sidewall of the upper programmable semiconductor fin portion, wherein the upper gate structure comprises a second gate dielectric material layer, a second work function setting layer, and a second gate electrode layer, and wherein the second gate dielectric material layer of the upper gate structure has a horizontal portion that is located directly on an upper surface of both the first work function setting layer and the first gate electrode layer of the lower gate structure, and the horizontal portion of the second gate dielectric material layer of the upper gate structure separates the second work function metal layer of the upper gate structure from both the first work function setting layer and the first gate electrode layer of the lower gate structure.

14. The method of claim 13, wherein the forming of the lower gate structure comprises:
forming an interlayer dielectric (ILD) material laterally surrounding and above the fin structure, wherein the ILD material has a gate opening the physically exposes the fin structure;
sequentially depositing the first gate dielectric material layer, the first work function setting layer and the first gate electrode layer in the gate opening; and
removing the first gate dielectric material layer, the first work function setting layer and the first gate electrode layer from the upper programmable semiconductor fin portion.

15. The method of claim 13, wherein the first and second threshold voltages are the same, and wherein the lower programmable semiconductor fin portion and the upper programmable semiconductor fin portion are programmed to have a same value.

16. The method of claim 15, wherein the lower programmable semiconductor fin portion and the upper programmable semiconductor fin portion are both programmed as "0" or "1".

17. The method of claim 13, wherein the first threshold voltage is different from the second threshold voltage, and wherein the lower programmable semiconductor fin portion and the upper programmable semiconductor fin portion are programmed to have a different value.

18. The method of claim 17, wherein the lower programmable semiconductor fin portion is programmed "0" or "1" and the upper programmable semiconductor fin portion is programmed the other of "0" or "1".

19. The method of claim 13, wherein the forming the fin structure comprises:
forming a structure comprising a semiconductor substrate, the insulator layer, a first semiconductor material layer, another insulator layer, and a second semiconductor material layer;
forming a first mask over a portion of the second semiconductor layer;
forming, by a first ion implantation process, a first programmable region in a first portion of the first semiconductor material layer not covered by the first mask;
forming, by a second ion implantation process, a first programmable region in a first portion of the second semiconductor material layer not covered by the mask, wherein the first programmable region in the first portion of the second semiconductor layer is located directly above the first programmable region in the first portion of the first semiconductor material layer;
removing the mask; and
patterning the structure.

20. The method of claim 13, wherein the forming the fin structure comprises:
forming a first structure comprising a semiconductor substrate, the insulator layer, and a first semiconductor material layer, wherein the first semiconductor material layer includes a first programmable region disposed therein;
forming a second structure comprising a second semiconductor material layer having a second programmable region disposed therein, wherein a second insulator layer is present on the second semiconductor material layer;
bonding the second insulator layer of the second structure to the first semiconductor layer of the first structure to provide a material stack of the semiconductor substrate, the insulator layer, the first semiconductor material layer including the programmable region, the another insulator layer, and the second semiconductor material layer containing the second programmable region located directly above the first programmable region; and
patterning the material stack.

* * * * *